United States Patent
Mancoff et al.

(10) Patent No.: US 7,635,903 B2
(45) Date of Patent: Dec. 22, 2009

(54) OSCILLATOR AND METHOD OF MANUFACTURE

(75) Inventors: Frederick B. Mancoff, Tempe, AZ (US); Bradley N. Engel, Chandler, AZ (US); Nicholas D. Rizzo, Gilbert, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 683 days.

(21) Appl. No.: 11/225,973

(22) Filed: Sep. 13, 2005

(65) Prior Publication Data
US 2007/0236105 A1    Oct. 11, 2007

(51) Int. Cl.
*H01L 29/00*   (2006.01)

(52) U.S. Cl. .............................. 257/422; 257/E43.004; 360/313; 331/2; 331/3; 331/94.1; 331/107 R

(58) Field of Classification Search ............ 257/9, 257/421, 422, E43.001, E27.008, E21.664, 257/E43.004; 360/313; 331/2, 3, 94.1, 107 R
See application file for complete search history.

(56) References Cited

U.S. PATENT DOCUMENTS

| | | |
|---|---|---|
| 5,695,864 A | 12/1997 | Slonczewski |
| 6,072,718 A * | 6/2000 | Abraham et al. ............ 365/173 |
| 6,153,320 A * | 11/2000 | Parkin ...................... 428/811.2 |
| 6,166,948 A * | 12/2000 | Parkin et al. ................ 365/173 |
| 2002/0064069 A1* | 5/2002 | Goebel et al. ............... 365/173 |

OTHER PUBLICATIONS

Slonczewski, J.C. "Current-Driven Excitation of Magnetic Multilayers", *Journal of Magnetism and Magnetic Materials* 159 (1996) L1-L7.
Rippard, et al., "Direct-Current Induced Dynamics in Co 90 Fe10/Ni 80 Fe 20 Point Contacts", *Physical Review Letters*, vol. 92, No. 2.
Berger, L. "Emission of Spin Waves by a Magnetic Multilayer Traversed by a Current", *Physical Review B*, vol. 54, No. 13, Oct. 1, 1996-1.
Rippard, et al., "Injection Locking and Phase Control of Spin Transfer Nano-Oscillators" *Physical Review Letters* 95, 067203 (2005), week ending Aug. 5, 2005.

* cited by examiner

*Primary Examiner*—Davienne Monbleau
*Assistant Examiner*—Matthew Reames
(74) *Attorney, Agent, or Firm*—Ingrassia, Fisher & Lorenz, P.C.

(57) ABSTRACT

An oscillator includes at least one of: (i) a parallel array of resistors (420, 421, 422, 701, 801, 901, 902) or magnetoresistive contacts to a magnetoresistive film (120, 320); and (ii) a series array of resistors (620, 621, 702, 902) or magnetoresistive contacts to individualized areas of at least one magnetoresistive film.

22 Claims, 3 Drawing Sheets

OSCILLATOR AND METHOD OF MANUFACTURE

GOVERNMENT LICENSE RIGHTS

This invention was made with Government support under Agreement No. MDA972-01-3-0004 awarded by the Defense Advanced Research Projects Agency (DARPA). The Government has certain rights in the invention.

FIELD OF THE INVENTION

This invention relates generally to oscillators, and relates more particularly to spin-transfer oscillators and their methods of manufacture.

BACKGROUND OF THE INVENTION

Giant magnetoresistive (GMR) or tunneling magnetoresistive (TMR) films typically include at least a tri-layered film of: a fixed magnetic layer, a non-magnetic layer next to the fixed magnetic layer, and a free magnetic layer on the opposite side of the non-magnetic layer. A GMR or TMR film has a low resistance when the polarization of the free magnetic layer is parallel to the polarization of the fixed magnetic layer, and the GMR or TMR film has a high resistance when the polarization of the free magnetic layer is anti-parallel to the polarization of the fixed magnetic layer. The resistance of the GMR or TMR film can oscillate from its high resistance to its low resistance and vice versa when the polarization of the free magnetic layer oscillates relative to the polarization of the fixed magnetic layer.

Within the past few years, oscillators have been created using the oscillating resistor characteristic of GMR and TMR films. These oscillators pass a current through a single submicrometer contact to the GMR or TMR film, which can be a conventional film or a patterned nanopillar structure. The current becomes spin-polarized while passing through the tri-layered GMR or TMR film, and then, by conserving angular momentum, the spin-polarized current exerts a torque on the GMR or TMR film. In an applied magnetic field, the spin-transfer torque can produce a steady-state precession of the magnetization of the free magnetic layer at microwave frequencies. As a result, the oscillator produces spin-transfer-induced oscillations.

These single submicrometer contact, spin-transfer oscillators have a significant disadvantage because they can generate only very limited amounts of output power, typically in the lower nanoWatt (nW) range. To be useful in practical device applications, however, these oscillators need to output as much power as possible, preferably in the microWatt ($\mu$W) range. Accordingly, a need exists for a technique to increase the output power for spin-transfer oscillators.

BRIEF DESCRIPTION OF THE DRAWINGS

The invention will be better understood from a reading of the following detailed description, taken in conjunction with the accompanying figures in the drawings in which.

Figure 1:
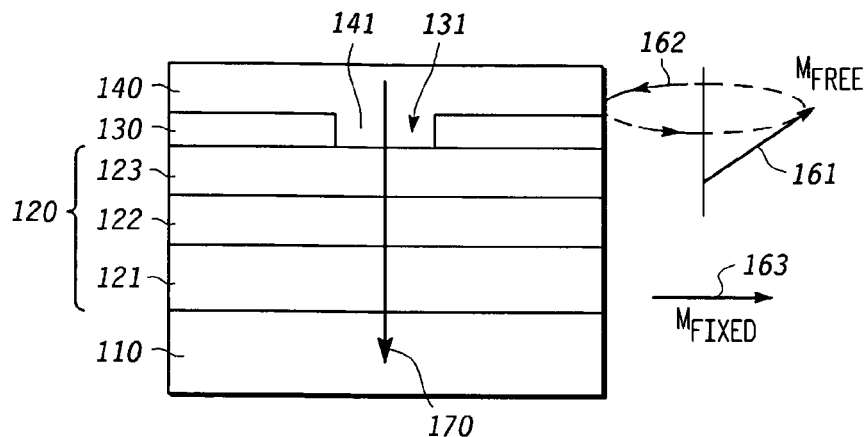
FIG. 1 illustrates a cross-sectional view of a portion of a spin-transfer oscillator in accordance with an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical, mechanical, or other manner, unless otherwise defined.

DETAILED DESCRIPTION OF EXEMPLARY EMBODIMENTS

Various embodiments of the present invention include multiple magnetoresistive or ferromagnetic point contacts to a magnetoresistive (MR) film, which can have a conventional film structure or a patterned nanopillar structure. The contacts are coupled together in one or more serial and/or parallel arrays to form an oscillator that has high output microwave power. The oscillators are spin-transfer based, electrically-controlled, and frequency tunable. As explained in detail below, different electrical circuit architectures can be used to form the arrays, thus permitting an increase in the output power without needing to exceed the limitations on output power for an individual point contact. The contacts are coupled such that the portions of the MR film underneath the contacts oscillate in unison to allow the total output microwave power of the oscillator to be increased while maintaining a fixed current through each point contact. The fixed current can be limited by electromigration within the MR film and the need to target a desired oscillation frequency of the output microwave power as a function of current.

Referring now to the figures, FIG. 1 illustrates a cross-sectional view of a portion of an oscillator 100. Oscillator 100 includes a base electrode 110. As an example, base electrode 110 can comprise an electrically conductive, non-magnetic material. In one embodiment, base electrode 110 comprises copper, aluminum, tungsten, titanium, gold, silver, doped single crystalline silicon, doped polycrystalline silicon, or the like.

Oscillator 100 also includes a magnetoresistive (MR) film 120 located over base electrode 110. MR film 120 can be a giant magnetoresistive (GMR) film, a tunneling magnetoresistive (TMR) film, or a colossal magnetoresistive (CMR) film. MR film 120 includes at least three layers: a fixed magnetic layer 121, a non-magnetic layer 122 over fixed magnetic layer 121, and a free magnetic layer 123 over non-magnetic layer 122. In one embodiment, fixed magnetic layer 121, non-magnetic layer 122, and free magnetic layer 123 comprise electrically conductive materials. In a different embodiment, fixed magnetic layer 121 and free magnetic layer 123 comprise the same or different electrically conductive materials, and non-magnetic layer 122 comprises a non-electrically conductive material.

As an example, fixed magnetic layer 121 can comprise ferromagnetic metals (including nickel, iron, cobalt, and the like), a ferromagnetic alloy (including nickel iron, nickel iron cobalt, cobalt iron, cobalt platinum, cobalt palladium, and the like), a ferromagnetic semiconductor (including gallium manganese arsenide, and the like), or a half-metallic ferromagnetic material (including chromium dioxide, nickel magnesium antimony, platinum magnesium antimony, iron oxide, and the like). Fixed magnetic layer 121 is preferably thicker than free magnetic layer 123 and also preferably has a stronger or larger magnetization than free magnetic layer 123 to resist a spin-transfer torque and its associated spin angular momentum that are created by a spin-polarized direct current (d.c.) current passing through MR film 120. As an example, fixed magnetic layer 121 can have a thickness of approximately ten to fifty nanometers (nm).

Additionally, non-magnetic layer 122 can comprise an electrical conductor (including copper, aluminum, aluminum copper, gold, silver, titanium, tungsten, and the like) or a non-electrically conductive tunnel barrier (including aluminum oxide, magnesium oxide, aluminum nitride, and the like). Non-magnetic layer 122 is preferably not too thin so as to prevent coupling between the magnetization of fixed magnetic layer 121 and free magnetic layer 123. Accordingly, non-magnetic layer 122 can also be referred to as a spacer layer because it spaces apart fixed magnetic layer 121 and free magnetic layer 123. Non-magnetic layer 122 is also preferably not too thick so as to weaken the spin-transfer effect from fixed magnetic layer 121 to free magnetic layer 123. As an example, non-magnetic layer 122 can have a thickness of approximately one to ten nm.

Furthermore, free magnetic layer 123 can comprise a permalloy material comprised of nickel and iron, and can also comprise any of the materials identified for fixed magnetic layer 121. As an example, free magnetic layer 123 can have a thickness of approximately three to ten nm.

Oscillator 100 also includes an electrically insulative layer 130 located over MR film 120. Electrically insulative layer 130 is patterned to expose several regions of MR film 120, but FIG. 1 illustrates a single opening 131. As an example, electrically insulative layer 130 can comprise silicon dioxide, silicon nitride, silicon oxy-nitride, hardened photoresist, and the like.

Oscillator 100 further includes a top electrode 140 located over electrically insulative layer 130. MR film 120 and base electrode 110 can collectively be referred to as a bottom electrode. A portion of top electrode 140 is located in opening 131 of electrically insulative layer 130, contacts MR film 120, and accordingly, can also be referred to as an MR contact. Although FIG. 1 illustrates a single MR contact, oscillator 100 has multiple MR contacts to MR film 120.

As an example, top electrode 140 can comprise an electrically conductive, non-magnetic material, including any of the materials identified previously for base electrode 110 and/or any of the electrical conductors identified previously for non-magnetic layer 122. In one embodiment, a portion 141 of top electrode 140 that contacts MR film 120 is also referred to as a ferromagnetic contact when MR film 120 comprises one or more ferromagnetic materials. In another embodiment, a diameter of portion 141 of top electrode 140 is approximately fifty to three hundred nm, and thus, in this embodiment, portion 141 is also referred to as a point contact due to its small size. When both of these embodiments are combined into a single embodiment, the portion of top electrode 140 that contacts MR film 120 is referred to as a ferromagnetic point contact. The combination and ordering of layers shown in FIG. 1 is one example for a spin-transfer point contact oscillator, but other layer structures are generally possible, too.

Free magnetic layer 123 has a variable magnetization indicated by solid arrow 161 ($M_{free}$), which moves or oscillates in the direction indicated by dashed arrows 162. Fixed magnetic layer 121 has a fixed magnetization indicated by arrow 163 ($M_{fixed}$). The magnetic configuration of $M_{free}$ and $M_{fixed}$ as illustrated in FIG. 1 provides one example, but other different and possibly more complicated configurations are also possible. The bias current passes through oscillator 100 in the direction indicated by arrow 170 in FIG. 1, or in the opposite direction for the opposite current polarity.

The microwave output power of oscillator 100 in FIG. 1 is determined by the magnitude of the current flow in oscillator 100 and also by the magnetoresistance of oscillator 100. More specifically, the microwave output power of oscillator 100 can be modeled as:

$$P_{ac} \propto I_{dc}^2 \Delta R_{ac},$$

where $I_{dc}$ is the d.c. bias current applied to MR film 120 and where $\Delta R_{ac}$ is the a.c. magnetoresistance of MR film 120 caused by the oscillation of free magnetic layer 123. The resistance difference $\Delta R_{ac}$ is less than or equal to the maximum $\Delta R_{max}$ Of the MR measured when the free and fixed layers are parallel and antiparallel. As stated previously, oscillator 100 in FIG. 1 has more than one MR contact, but using the above-identified equation, one skilled in the art will understand that the output power of an oscillator having a single MR contact is limited by three main factors.

First, the output power is limited by the a.c. magnetoresistance of MR film 120, which is limited by $\Delta R_{max}$, and the $\Delta R_{max}$ is determined by the composition of MR film 120. For example, if MR film 120 is a GMR film, then the a.c. magnetoresistance is determined by the giant magnetoresistance spin valve of MR film 120. Additionally, if MR film 120 is a TMR film, then the a.c. magnetoresistance is determined by the magnetic tunnel junction of MR film 120. Second, the output power is also limited by the magnitude of the d.c. bias current, which is limited by the onset of electromigration damage to oscillator 100. Moreover, for the magnetization configuration shown in FIG. 1, the d.c. current is approximately proportional to the oscillation frequency of oscillator 100 so the d.c. bias current is also fixed or determined by the desired oscillation frequency of oscillator 100.

Figure 2:
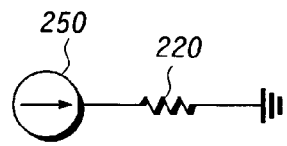
FIG. 2 illustrates a schematic diagram of the portion of the spin-transfer oscillator in FIG. 1 in accordance with an embodiment of the invention.

FIG. 2 illustrates a schematic diagram or circuit 200 that represents the portion of oscillator 100 illustrated in FIG. 1. Circuit 200 includes a current source 250 that passes a current through MR film 120 in FIG. 1. As an example, current source 250 can be a d.c. current source. Circuit 200 also includes a resistor 220, which represents the resistance of MR film 120 in FIG. 1 from the MR contact through free magnetic layer 123, through non-magnetic layer 122, and through fixed magnetic layer 121.

The resistance of resistor 220 varies or, more specifically, oscillates as the magnetization of free magnetic layer 123 changes, and the resistance can be expressed or modeled as:

$$R = R_0 + \frac{\Delta R}{2}\cos\omega t,$$

where $R_0$ is the average resistance of the contact in FIG. 1, where $\Delta R$ is a fraction of the total magnetoresistance $\Delta R_{max}$ of MR film 120 (FIG. 1), where $\omega$ is frequency of the magnetization oscillation, and where t is time.

Figure 3:
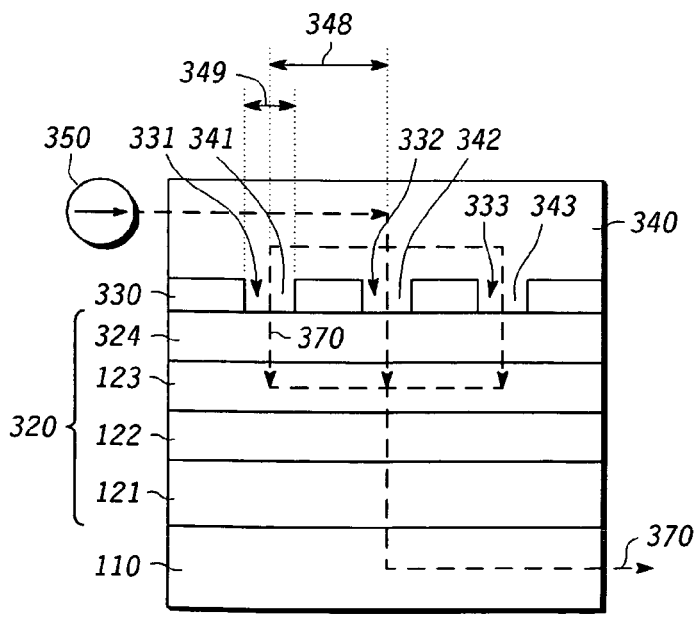
FIG. 3 illustrates a cross-sectional view of a spin-transfer oscillator in accordance with an embodiment of the invention.

FIG. 3 illustrates a cross-sectional view of an oscillator 300, which can be an embodiment of oscillator 100 in FIG. 1. Oscillator 300 includes, among other features, an MR film 320. MR film 320 is similar to MR film 120 in FIG. 1, but MR film 320 has an additional, but optional, cap layer 324 over free magnetic layer 123. Cap layer 324 is used to protect free magnetic layer 123 during the formation and patterning of subsequent layers over MR film 320. As an example, cap layer 324 can comprise non-magnetic, electrically conductive materials such as, for example, copper, palladium, tungsten, aluminum, and the like, and can have a thickness of approximately two to ten nm.

Oscillator 300 also includes an electrically insulative layer 330. Electrically insulative layer 330 can be similar to electrically insulative layer 130 in FIG. 1, but electrically insulative layer 330 is patterned to expose three regions of MR film 320. One skilled in the art understands that electrically insulative layer 330 is not limited to three openings 331, 332, and 333, but instead, can have two openings or four or more openings.

Oscillator 300 additionally includes a top electrode 340, which can be similar to top electrode 140 in FIG. 1. MR film 320 and base electrode 110 can collectively be referred to as a bottom electrode. Three portions 341, 342, and 343 of top electrode 340 are located in openings 331, 332, and 333, respectively, of electrically insulative layer 330. Portions 341, 342, and 343 can be similar to portion 141 in FIG. 1 and, accordingly, can also be referred to as three MR contacts. As illustrated in FIG. 3, the three MR contacts are electrically coupled or connected together in parallel by other portions of top electrode 340, among other portions of oscillator 300. As explained previously with respect to FIG. 1, the MR contacts can also be referred to as point contacts, MR point contacts, ferromagnetic contacts, ferromagnetic point contacts, and the like, under the appropriate conditions.

As illustrated in FIG. 3, oscillator 300 has a parallel array of three MR contacts to MR film 320. Although FIG. 3 illustrates three MR contacts, one skilled in the art understands that, in other embodiments, top electrode 340 can have two MR contacts or four or more MR contacts. Accordingly, oscillator 300 can have a quantity of "N" MR contacts, where N is greater than 1. The "N" MR contacts of oscillator 300 can be located over and can be electrically coupled to different embodiments of MR film 320, including a conventional MR film as illustrated in FIG. 3 or a patterned nanopillar structure of one or more MR films.

Oscillator 300 also includes a current source 350, which can be similar to current source 250 in FIG. 2. In the embodiment illustrated in FIG. 3, the current from current source 350 moves through oscillator 300 in the direction indicated by dashed arrows 370 (or opposite to the arrows for the opposite current polarity). If a d.c. current "I" is needed through each individual MR contact to excite a particular spin-transfer oscillation frequency in MR film 320, then current source 350 provides a total current of (N×I), where N represents the quantity of MR contacts in oscillator 300. Calculations show the microwave output power for oscillator 300 should be approximately N times greater than for a different oscillator having a single MR contact with current "I." Accordingly, having an array of parallel MR contacts, oscillator 300 provides greater output power than a different oscillator having a single MR contact.

To achieve the desired increased power from the parallel array of oscillator 300 requires the spin-transfer oscillations in all three parallel portions of MR film 320 to be phase-locked with each other so as to oscillate at the same frequency. For the maximum power increase, the phase-locking should preferably have zero phase difference. This coupling of the three parallel portions of MR film 320 can be achieved by forming all three of the MR contacts to the same section of MR film 320, as shown in FIG. 3. Each MR contact or, more specifically, each point contact excites spin-transfer oscillations in the portion of MR film 320 located directly below that point contact as well as in an area extending laterally into MR film 320. Previous measurements demonstrated that the oscillation range extends laterally by approximately fifty nm around the physical area of the point contact.

Present measurements show that phase-locking between parallel portions of MR film 320 can occur between two neighboring or parallel point contacts (i.e., N equals two) when the spacing between them is small enough so that their oscillating regions in MR film 320 overlap. In other words, the coupling or phase-locking between the adjacent and parallel oscillating regions in MR film 320 can be achieved by direct interaction of these regions when the regions are located sufficiently close to each other. For the case of a parallel array in a conventional MR film, the spin-transfer oscillations may be excited by exchange coupling and/or dipole-dipole magnetic fields. For the case of a parallel array of nanopillars, the spin-transfer oscillations may be excited in physically separated portions of MR film, in which case dipole-dipole magnetic fields can provide the coupling mechanism even though the magnetically oscillating film regions do not directly touch or physically contact each other.

For two adjacent and symmetric point contacts that each have a diameter (i.e., distance 349 in FIG. 3) of approximately eighty nm, present measurements show that strong coupling occurs when the center-to-center spacing of the two adjacent point contacts (i.e., distance 348 in FIG. 3) is less than approximately two hundred nm. In one embodiment to provide strong phase-locking of adjacent parallel regions in MR film 320, diameter or distance 349 in FIG. 3 is approximately eighty nm, and center-to-center spacing or distance 348 is approximately one hundred twenty to one hundred fifty nm. In other embodiments, the point contacts can have diameters of approximately fifty to three hundred nm, and the maximum center-to-center spacing of adjacent point contacts can be less than two hundred nm when the diameter is closer to fifty nm and can be greater than two hundred nm when the diameter is closer to three hundred nm.

In one embodiment of oscillator 300, base electrode 110 and MR film 320 are sputter-deposited as follows: a five nm palladium (i.e., Pd)/twenty-five nm copper (i.e., Cu) base electrode, a twenty-five nm cobalt iron (i.e., $Co_{81}Fe_{19}$) fixed magnetic layer, a six nm copper (i.e., Cu) spacer, a four-and-a-half nm nickel iron (i.e., $Ni_{80}Fe_{20}$) free magnetic layer, and a two nm copper (i.e., Cu)/three-and-a-half nm palladium (i.e., Pd) cap layer. Further in this embodiment, MR film 320 was patterned to sizes as small as eight micrometers (μm), and an electrically insulative layer comprised of silicon dioxide (i.e., $SiO_2$) was patterned over MR film 320 using electron beam lithography followed by reactive ion etching to form two vias through the electrically insulative layer to MR film 320.

Additional present measurements of these two point contact oscillators show oscillation frequencies in the range of approximately ten to thirty GigaHertz (GHz) with source, input, or bias d.c. currents in the range of approximately twenty to sixty milliAmperes (mA). Thus, oscillators such as oscillators 300 are frequency tunable. Other present measurements of these two point contact oscillators show an output power in the range of ten to fifty nanoWatts per Ampere-squared ($nW/A^2$) with source or input currents in the range of approximately twenty to sixty mA. These present measurements show that, when N equals two in oscillator 300, the output power is double the output power of an oscillator having a single point contact to an MR film.

Figure 4:
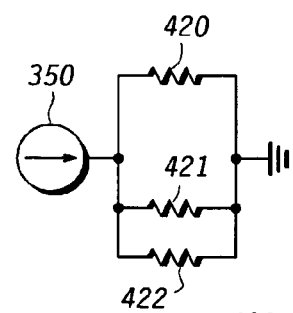
FIG. 4 illustrates a schematic diagram of the spin-transfer oscillator in FIG. 3 in accordance with an embodiment of the invention.

FIG. 4 illustrates a schematic diagram or circuit 400 that represents oscillator 300 in FIG. 3. Circuit 400 includes, among other elements, three resistors 420, 421, and 422. Resistors 420, 421, and 422 are phase-coupled with each other, electrically coupled or connected in parallel with each other, and electrically coupled or connected in series with current source 350. Resistors 420, 421, and 422 represent the resistance of MR film 320 in FIG. 3, as determined by the array of parallel portions 341, 342, and 343 (or three parallel MR contacts) to MR film 320. The electrical behavior of resistors 420, 421, and 422 are similar to the electrical behavior of resistor 220 described previously with respect to FIG. 2. Accordingly, the resistance of resistors 420, 421, and 422 varies or oscillates with respect to time as the magnetization of free magnetic layer 123 changes.

Figure 5:
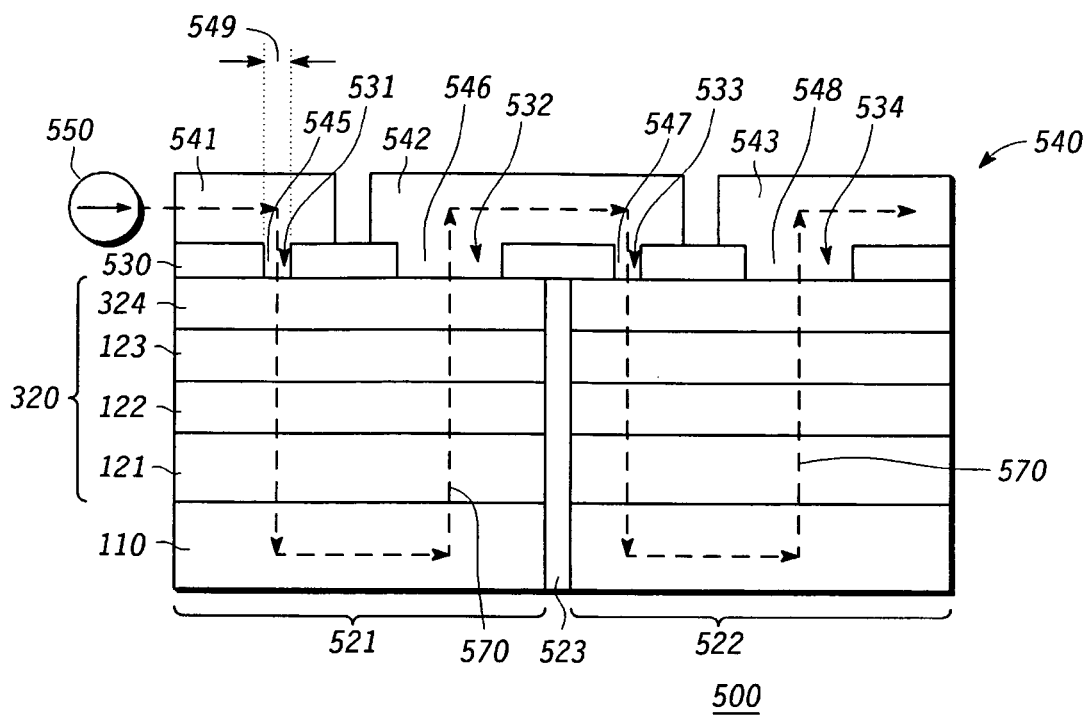
FIG. 5 illustrates a cross-sectional view of a different spin-transfer oscillator in accordance with an embodiment of the invention.

FIG. 5 illustrates a cross-sectional view of an oscillator 500, which can be another embodiment of oscillator 100 in FIG. 1. Oscillator 500 includes, among other features, MR film 320 and base electrode 110, both of which are separated into two distinct, discrete, or individualized regions 521 and 522. Regions 521 and 522 are separated by a region 523 that is non-magnetoresistive and non-electrically conductive. As an example, region 523 can be comprised of silicon dioxide, silicon nitride, silicon oxy-nitride, and the like. In a different embodiment, regions 521 and 522 can be formed from different MR films.

Oscillator 500 further includes an electrically insulative layer 530. Electrically insulative layer 530 can be similar to electrically insulative layer 130 in FIG. 1, but electrically insulative layer 530 is patterned to expose four regions of MR film 320. One skilled in the art understands that electrically insulative layer 530 is not limited to four openings 531, 532, 533, and 534, but instead, can have more or less than four openings.

In one embodiment, electrically insulative layer 530 has an even number of openings. In another or the same embodiment, openings 531 and 533 have the same or a similar size and can be similar in size to openings 331, 332, and 333 in FIG. 1. In this embodiment, openings 532 and 534 have the same or a similar size, but are larger than openings 531 and 533, as explained in more detail below. As an example, openings 532 and 534 can have diameters that are three times the size or larger of openings 531 and 533.

Oscillator 500 additionally includes a top electrode 540, which can be similar to top electrode 140 in FIG. 1. Again, MR film 320 and base electrode 110 can collectively be referred to as a bottom electrode. As illustrated in FIG. 5, top electrode 540 is divided in three sections 541, 542, and 543. A portion 545 of section 541 is located in opening 531 of electrically insulative layer 530. Portions 546 and 547 of section 542 are located in openings 532 and 533, respectively, of electrically insulative layer 530. A portion 548 of section 543 is located in opening 534 of electrically insulative layer 530. Portions 545, 546, 547, and 548 contact MR film 320.

Portions 545 and 547 can be similar to portion 141 in FIG. 1 and can have a diameter or distance 549 that is similar to diameter or distance 349 in FIG. 3. Accordingly, portions 545 and 547 can also be referred to as two MR contacts, point contacts, MR point contacts, ferromagnetic contacts, ferromagnetic point contacts, and the like, under the appropriate conditions. Although portions 545 and 547 can be point contacts, portions 546 and 548 are not point contacts because: (1) openings 532 and 534 (in which portions 546 and 548 are located) are larger than openings 531 and 533 (in which portions 545 and 547 are located); and (2) the larger size of openings 532 and 534 gives a much smaller current density in the respective underlying areas of MR film 320 than in the areas of MR film 320 that underlie openings 531 and 533, so that oscillations in the MR film 320 are negligible and so that the microwave output power is dominated by the spin-transfer effect around smaller openings 531 and 533.

In other words, (1) the current densities through portions 546 and 548 (and the respective underlying portions of MR film 320) are smaller than the current densities through portions 545 and 547 (and the respective underlying portions of MR film 320); (2) the smaller current densities through portions 546 and 548 (and the respective underlying portions of MR film 320) are less than the minimum current density needed to create the spin-transfer effect and oscillations for oscillator 500; and (3) the larger current densities through portions 546 and 548 (and the respective underlying portions of MR film 320) are greater than the minimum current density needed to create the spin-transfer effect and oscillations for oscillator 500. Also, the amplitude of spin-transfer oscillations is typically larger for one current polarity than for the opposite current polarity. Therefore, because the current through openings 531 and 533 is of opposite polarity to openings 532 and 534, the polarity of current flow can be chosen so that openings 531 and 533 have the correct polarity for a large spin-transfer effect while openings 532 and 534 do not. Thus, as illustrated in FIG. 5, oscillator 500 has a series array of two MR contacts to MR film 320.

Although FIG. 5 illustrates two MR point contacts, one skilled in the art understands that top electrode 540 can have more than two MR point contacts (i.e., a quantity of "N" MR contacts, where N is greater than 1). In one embodiment, MR point contacts, or portions 545 and 547 can have a diameter of approximately fifty to three hundred nm, and portions 546 and 548 can have a diameter of greater than six hundred nm. The "N" MR contacts of oscillator 500 can be located over and can be electrically coupled to different embodiments of MR film 320, including a conventional MR film as illustrated in FIG. 5 or a patterned nanopillar structure of one or more MR films.

Oscillator 500 also includes a current source 550, which can be similar to current source 250 in FIG. 2. In the embodiment illustrated in FIG. 5, the current from current source 550 moves through oscillator 500 in the direction indicated by dashed arrows 570, or in the opposite direction for the opposite polarity.

For oscillator 500 to achieve the desired power increase, the spin-transfer oscillations for all MR point contacts in the series array need to be coupled in-phase. Because the bottom electrode (i.e., MR film 320 and base electrode 110) is broken into two separate sections or regions 521 and 522, the excited portions of MR film 320 are not coupled directly as for the parallel array in oscillator 300 of FIG. 3. Therefore, the spacing length scale for coupling of adjacent regions of an MR film discussed above for oscillator 300 in FIG. 3 may not apply for the series array in oscillator 500 of FIG. 5.

To achieve the desired power increase in this case, however, either injection current locking to oscillations in the shared series current or radiative magnetic dipole coupling can be used to synchronize the oscillating portions of MR film 320 in the series array. In the preferred embodiment, the series array is driven by a constant voltage instead of a constant current, so that the spin-transfer oscillations in MR film 320 under one MR point contact (i.e., portion 545) will vary its resistance through a GMR or TMR effect and cause oscillations in the current through the next or second MR point contact (i.e., portion 547) in the series chain. The spin-transfer oscillations in the portion of MR film under the second MR point contact (i.e., portion 547) can be injection-locked to the current and, therefore, to the portion of MR film 320 under the first MR contact (i.e., portion 545). Additional coupling for phase-locking can be achieved when the portion of MR film 320 under one MR point contact (i.e., portion 547) senses the radiating magnetic field generated by a neighboring oscillating region of MR film 320 (i.e., under portion 545). In the illustrated embodiment, however, current source 550 is used so that radiative coupling is the only means for phase-locking the oscillators.

In the preferred embodiment for oscillator 500 where a voltage source is used in place of current source 550, calculations show the microwave output power should be approximately N times greater than for a different oscillator having a single MR point contact with current "I." Accordingly, having an array of serial MR point contacts, oscillator 500 provides greater output power than a different oscillator having a single MR point contact.

Figure 6:
FIG. 6 illustrates a schematic diagram of the spin-transfer oscillator in FIG. 5 in accordance with an embodiment of the invention.

FIG. 6 illustrates a schematic diagram or circuit 600 that represents oscillator 500 in FIG. 5. Circuit 600 includes, among other elements, two resistors 620 and 621. Resistors 620 and 621 are coupled in series with each other and are coupled in series with current source 550. Resistors 620 and 621 represent the resistance of MR film 320 in FIG. 5, as determined by the array of portions 545 and 547 (or two series MR point contacts) to MR film 320. The electrical behavior of resistors 620 and 621 are similar to the electrical behavior of resistor 220 described previously with respect to FIG. 2. Accordingly, the resistance of resistors 620 and 621 varies or oscillates with respect to time as the magnetization of free magnetic layer 123 changes.

Figure 7:
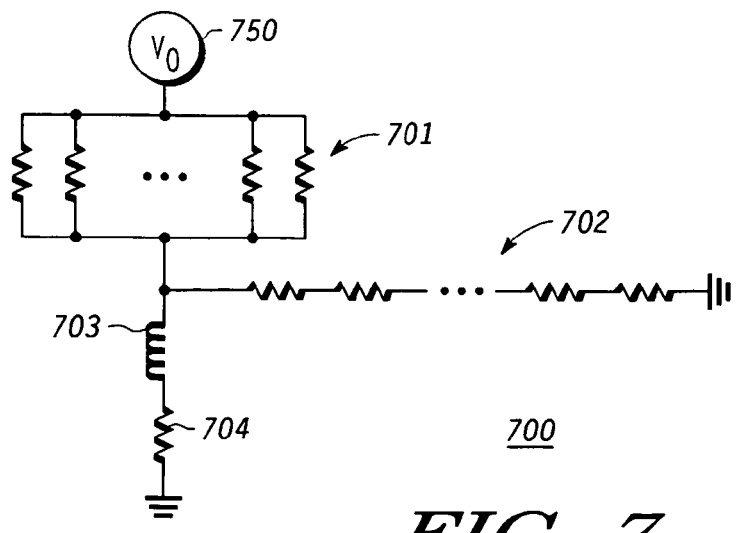
FIG. 7 illustrates a schematic diagram of another spin-transfer oscillator in accordance with an embodiment of the invention.

FIG. 7 illustrates a schematic diagram or circuit 700 that represents another oscillator. Circuit 700 includes a parallel array of resistors 701, a series array of resistors 702, an inductor 703, a resistor 704, and a voltage source 750. More specifically, parallel array of resistors 701 can be similar to the MR point contacts and the associated portions of MR film 320 in FIG. 3, except that parallel array of resistors 701 in FIG. 7 includes a parallel array of $N_1$ (instead of three) MR point contacts and portions of an MR film. Accordingly, parallel array of resistors 701 can also be referred to as a parallel array of MR point contacts to a MR film. FIG. 7 illustrates $N_1$ to be greater than 4, but in other embodiments, $N_1$ can be four or less and greater than one.

Additionally, series array of resistors 702 can be similar to the MR point contacts and the associated portions of MR film 320 in FIG. 5, except that series array of resistors 702 includes a series array of $N_2$ (instead of two) MR point contacts and portions of an MR film. Accordingly, series array of resistors 702 can also be referred to as a series array of MR point contacts to an MR film. FIG. 7 illustrates $N_2$ to be greater than four, but in other embodiment, $N_2$ can be four or less and greater than one. The MR films for parallel array of resistors 701 and for series array of resistors 702 can be the same MR film or different MR films.

Furthermore, voltage source 750, parallel array of resistors 701, inductor 703 and resistor 704 are in series with each other, and voltage source 750, parallel array of resistors 701, and series array of resistors 702 are in series with each other. Accordingly, inductor 703 and resistor 704 are in parallel with series array of resistors 702.

Circuit 700 represents an improvement over circuits 400 and 600 in FIGS. 4 and 6, respectively. In particular, as compared to circuit 600 in FIG. 6, the injection locking mechanism of circuit 700 is more effective by coupling parallel array of resistors 701 in series with series array of resistors because parallel array of resistors 701 will produce stronger oscillations in the current injected into series array of resistors 702. An applied voltage bias from voltage source 750 excites resistance oscillations in parallel array of resistors 701 and, therefore, oscillations in the current through series array of resistors 702. A larger number of $N_1$ resistors in parallel array of resistors 701 increases the magnitude of the current oscillations, which increases the strength of injection locking in series array of resistors 702.

As explained previously with respect to FIG. 3, if every parallel portion of the MR film for parallel array of resistors 701 requires a d.c. current I to excite its spin-transfer frequency, then the total d.c. current through parallel array of resistors 701 will be the product of $N_1$ times I. The total d.c. current through series array of resistors 702, however, needs to be only I. Therefore, a constant shunt resistor or resistor 704 provides an additional current path in order to shunt the excess d.c. current away from series array of resistors 702. Accordingly, resistor 704 ensures an equal d.c. current bias for all MR contacts in circuit 700.

Inductor 703 is in series with resistor 704 and has a high impedance at high frequency. Therefore, inductor 703 will direct the a.c. current away from the shunt path of resistor 704 and towards series array of resistors 702. Accordingly, inductor 703 confines the microwave power to the MR contacts and the MR film(s).

Altogether, the features of circuit 700 enable a power increase by a factor that is approximately proportional to a sum of $N_1$ plus $N_2$ when compared to a different oscillator having a single MR contact to an MR film.

Figure 8:
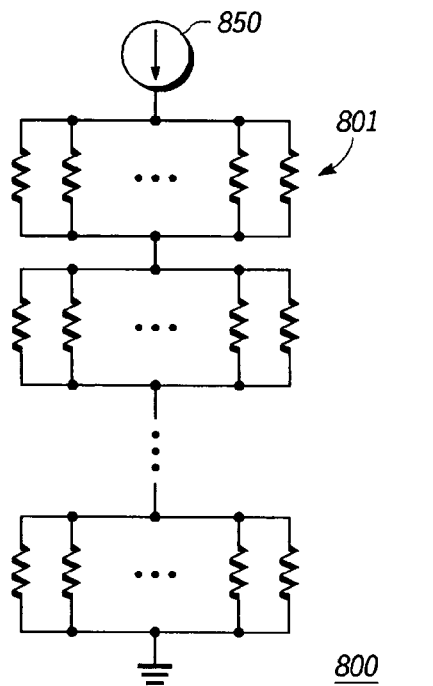
FIG. 8 illustrates a schematic diagram of yet another spin-transfer oscillator in accordance with an embodiment of the invention.

FIG. 8 illustrates a schematic diagram or circuit 800 that represents yet another oscillator. Circuit 800 includes $N_2$ parallel arrays of resistors 801, where each parallel array of resistors 801 is coupled in series and has $N_1$ resistors. Accordingly, the $N_2$ parallel arrays of $N_1$ resistors coupled in series can also be referred to as a hybrid series/parallel array. FIG. 8 illustrates $N_1$ to be greater than four, but in other embodiments, $N_1$ can be four or less and greater than one. FIG. 8 also illustrates $N_2$ to be greater than three, but in other embodiments, $N_2$ can be three or less and greater than one. Also in the embodiment illustrated in FIG. 8, each of the $N_2$ parallel arrays has the same number, i.e., $N_1$, of resistors in parallel with each other.

Each parallel array of resistors 801 can be similar to the MR contacts and associated portions of MR film 320 in FIG. 3, except that each parallel array of resistors 801 in FIG. 8 includes a parallel array of $N_1$ (instead of three) MR contacts and portions of an MR film. Accordingly, each parallel array of resistors 801 can be referred to as a parallel array of MR contacts to an MR film. The MR films for each parallel array of resistors 801 can be the same MR film or different MR films.

Circuit 800 also includes a current source 850, which can be similar to current source 250 in FIG. 2. Current source 850 is electrically coupled or connected in series with the $N_2$ parallel arrays of resistors 801.

Assuming all the individual portions of one or more MR film(s) located under the MR contacts are coupled in-phase with each other, the following calculations show the total microwave output power of circuit 800 to be increased by a factor that is approximately proportional to the product of $N_1$ times $N_2$ when compared to a different oscillator having a single MR contact to an MR film. Thus, the hybrid array of circuit 800 has an output power increase that is approximately proportional to the size of both the parallel and series components in circuit 800. Another consideration is the inclusion of a parasitic resistance ($R_{parasitic}$) in series with circuit 800 in FIG. 8 due to the metal lines (i.e., top electrodes 140, 340, and/or 540 in FIGS. 1, 3, and 5, respectively) plus any additional circuitry connecting circuit 800. The following calculations also show that the power efficiency (defined as the ratio of the microwave power output to the d.c. power input) of circuit 800 is greater than an oscillator having a single MR contact when $N_2$ is greater than $N_1$:

(1) The total current in the hybrid array is ($N_1 \times I$).

(2) The resistance of one array of $N_1$ resistors in parallel is:

$$R = \left(R_0 + \frac{\Delta R}{2}\cos\omega t\right)/N_1.$$

(3) For $N_2$ of the arrays of $N_1$ resistors in parallel and including $R_{parasitic}$:

$$R_{hybrid} = R_{parasitic} + \frac{N_2}{N_1}\left(R_0 + \frac{\Delta R}{2}\cos\omega t\right),$$

where $R_{hybrid}$ is the total resistance of circuit 800.

(4) The d.c. output power of circuit 800 is:

$$P_{dc}=(N_1 I)^2 R_{hybrid}=I^2(N_1^2 R_{parasitic}+N_1 N_2 R_0).$$

(5) The peak-to-peak microwave output power of circuit 800 is:

$$P_{pk\text{-}pk} = (N_1 I)^2 \frac{N_2}{N_1}\frac{\Delta R}{2} \cdot 2 = N_1 N_2 I^2 \Delta R.$$

(6) Thus, the efficiency of circuit 800 is defined as $$\frac{P_{pk\text{-}pk}}{P_{dc}} = \frac{\Delta R}{\left(\frac{N_1}{N_2}R_{parasitic} + R_0\right)}.$$

(7) When an oscillator has a single MR contact, $N_1$ and $N_2$ both equal one so $$\frac{P_{pk\text{-}pk}}{P_{dc}} = \frac{\Delta R}{(R_{parasitic} + R_0)}.$$

An advantage of the hybrid array used in circuit 800 is the flexibility to choose whether the a.c. output power will be increased by adding MR contacts in series (increasing $N_2$) or in parallel (increasing $N_1$). Thus, $N_1$ and $N_2$ can be adjusted in case differences exist in the number of contacts that can be effectively coupled together in parallel versus in series, or vice versa.

Figure 9:
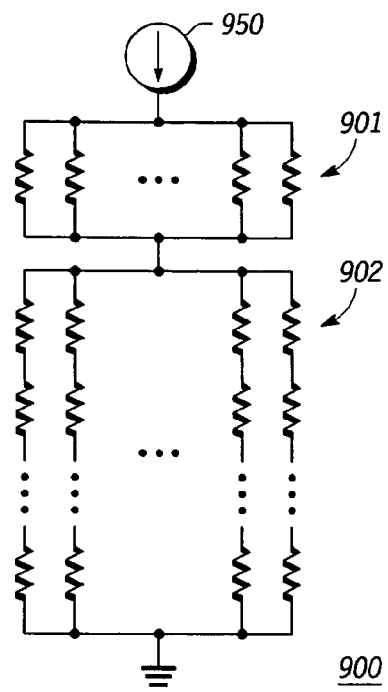
FIG. 9 illustrates a schematic diagram of an additional spin-transfer oscillator in accordance with an embodiment of the invention.

FIG. 9 illustrates a schematic diagram or circuit that represents an additional oscillator. Circuit 900 includes a parallel array of resistors 901 having $N_1$ resistors in parallel. FIG. 9 illustrates $N_1$ to be greater than four, but in other embodiments, $N_1$ can be four or less and greater than one. Circuit 900 also includes a parallel/series hybrid array of resistors 902, which comprises $N_1$ series arrays of $N_2$ resistors where each of the $N_1$ series arrays are in parallel with each other. FIG. 9 illustrates $N_2$ to be greater than three, but in other embodiments, $N_2$ can be three or less and greater than one.

Parallel array of resistors 901 can be similar to the MR contacts and associated portions of MR film 320 in FIG. 3, except that parallel array of resistors 901 in FIG. 9 includes a parallel array of $N_1$ (instead of three) MR contacts and portions of an MR film. Accordingly, parallel array of resistors 901 can be referred to as a parallel array of MR contacts to an MR film.

Each series array of $N_2$ resistors in FIG. 9 can be similar to the MR point contacts and associated portions of MR film 320 in FIG. 5, except that each series array of $N_2$ resistors in FIG. 9 includes a series array of $N_2$ (instead of two) MR point contacts and portions of an MR film. Accordingly, each series array of $N_2$ resistors in FIG. 9 can be referred to as a series array of MR point contacts to an MR film. The MR films for each series array of resistors in parallel/series hybrid array of resistors 902 can be the same MR film or different MR films, and the one or more MR films in parallel/series hybrid array of resistors 902 can be the same or a different MR film(s) as used in parallel array of resistors 901.

Circuit 900 also includes a current source 950, which can be similar to current source 250 in FIG. 2. Current source 950 is electrically coupled or connected in series with parallel array of resistors 901 and parallel/series hybrid array of resistors 902. Each of the series arrays of $N_2$ resistors in parallel/series hybrid array of resistors 902 is phase-locked by injection locking to parallel array of resistors 901.

Assuming all the individual portions of one or more MR film(s) located under the MR contacts are coupled in-phase with each other, the following calculations show the total microwave output power of circuit 900 to be increased by a factor that is approximately proportional to the product of $N_1$ times the sum of $N_2$ plus one when compared to a different oscillator having a single MR contact to an MR film. Thus, the hybrid array of circuit 900 in FIG. 9 allows an output power increase approximately proportional to the size of both the parallel and series components in circuit 900. Moreover, when also considering the parasitic resistance ($R_{parasitic}$) in series with the oscillator circuit in FIG. 9, the following calculations also show that circuit 900 has greater efficiency than an oscillator having a single MR contact when $N_2$ is greater than $N_1$:

(1) Parallel array of resistors 901 has a resistance defined as $$R_{901} = \frac{1}{N_1}\left(R_0 + \frac{\Delta R}{2}\cos\omega t\right).$$

(2) Each series array of $N_2$ resistors in parallel/series hybrid array of resistors 902 has a resistance defined as $$R = N_2\left(R_0 + \frac{\Delta R}{2}\cos\omega t\right).$$

(3) Parallel/series hybrid array of resistors 902 has a resistance defined as $$R_{902} = \frac{N_2}{N_1}\left(R_0 + \frac{\Delta R}{2}\cos\omega t\right).$$

(4) Therefore, the total resistance of circuit 900 is defined as $$R_{900} = R_{parasitic} + \frac{(N_2+1)}{N_1}\left(R_0 + \frac{\Delta R}{2}\cos\omega t\right).$$

(5) The total current in the composite or entire hybrid array of circuit 900 is ($N_1 \times I$).

(6) The d.c. output power of circuit 900 is:

$$P_{dc} = (N_1 I)^2 R_{900} = I^2(N_1^2 R_{parasitic} + N_1(N_2+1)R_0)$$

(7) The peak-to-peak microwave output power of circuit 900 is:

$$P_{pk\text{-}pk} = (N_1 I)^2 \frac{(N_2+1)}{N_1}\frac{\Delta R}{2}\cdot 2 = N_1(N_2+1)I^2\Delta R.$$

(8) Thus, the efficiency of circuit 900 is defined as $$\frac{P_{pk\text{-}pk}}{P_{dc}} = \frac{\Delta R}{\left(\frac{N_1}{(N_2+1)}R_{parasitic} + R_0\right)}.$$

(9) When an oscillator has a single MR contact, $N_1$ equals one, and $N_2$ equals zero so $$\frac{P_{pk\text{-}pk}}{P_{dc}} = \frac{\Delta R}{(R_{parasitic} + R_0)}.$$

As with the circuit 800 in FIG. 8, circuit 900 in FIG. 9 allows flexibility to increase a.c. output power either by increasing $N_1$ or $N_2$ as desired within the limits of the strength of the parallel or series phase-coupling mechanisms.

Figure 10:
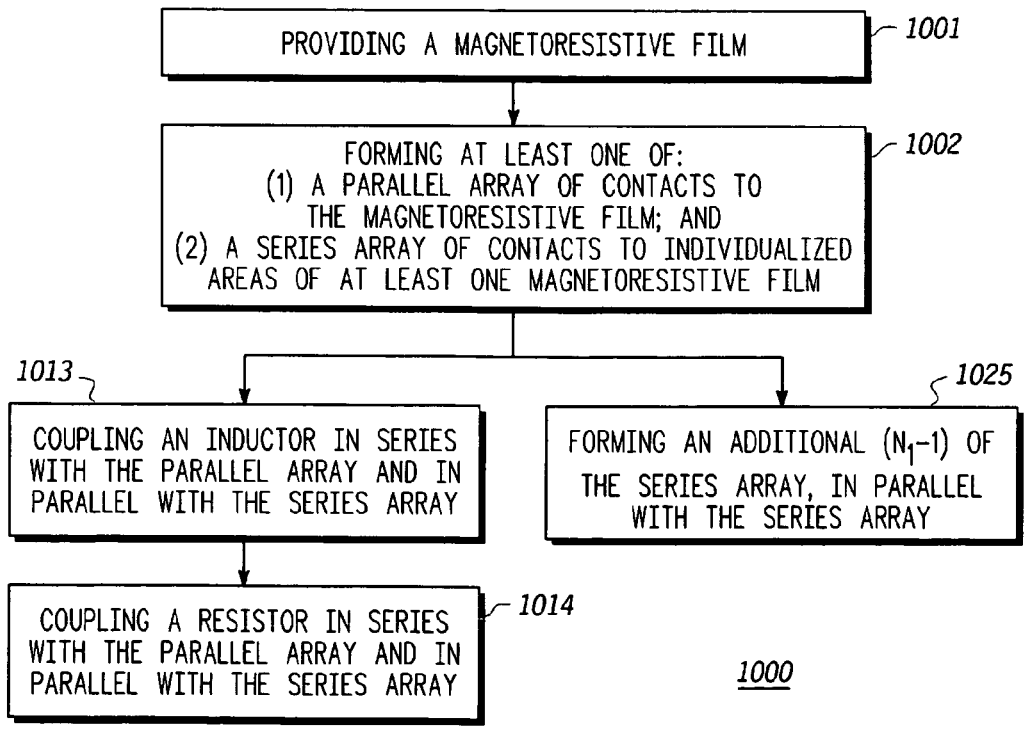
FIG. 10 illustrates a flow chart of a method of manufacturing an oscillator in accordance with an embodiment of the invention.

FIG. 10 illustrates a flow chart 1000 of a method of manufacturing an oscillator in accordance with an embodiment of the invention. Flow chart 1000 can be used to manufacture the various embodiments of oscillators illustrated in FIGS. 1 through 9.

Flow chart 1000 includes a step 1001 for providing a magnetoresistive film. As an example, the magnetoresistive film of step 1001 can be similar to MR films 120 and 320 in FIGS. 1 and 3, respectively. Flow chart 1000 continues with a step 1002 for forming at least one of a parallel array of contacts to the magnetoresistive film and a series array of contacts to individualized areas of at least one magnetoresistive film, which includes the magnetoresistive film of the parallel array of contacts. As an example, the parallel array of contacts to the magnetoresistive film in step 1002 can be similar to resistors 420, 421, and 422 in FIG. 4 and also to parallel array of resistors 701 in FIG. 7, 801 in FIG. 8, and 901 and 902 in FIG. 9. As another example, the series array of contacts to individualized areas of at least one magnetoresistive film can be similar to resistors 620 and 621 in FIG. 6 and can also be similar to series array of resistors 702 in FIGS. 7 and 902 in FIG. 9.

In one embodiment, flow chart 1000 includes steps 1013 and 1014. Step 1013 couples an inductor in series with the parallel array and in parallel with the series array. As an example, the inductor of step 1013 can be similar to inductor 703 in FIG. 7. Step 1014 couples a resistor in series with the parallel array and in parallel with the series array. As an example, the resistor of step 1014 can be similar to resistor 704 in FIG. 7. Step 1014 can also couple the resistor in series with the inductor of step 1013. Steps 1013 and 1014 can be performed sequentially before or after step 1002, or simultaneously with each other. When steps 1013 and 1014 are performed sequentially, the order of steps 1013 and 1014 may be reversed from the order illustrated in FIG. 10. Steps 1013 and 1014 can also be performed simultaneously with step 1002.

In a different embodiment, flow chart 1000 includes a step 1025. Step 1025 forms an additional $N_1$ minus one of the series array formed in step 1002, where the additional series arrays of step 1025 are coupled in parallel with the series array formed in step 1002. Step 1025 can be performed sequentially before or after step 1002, or step 1025 can be performed simultaneously with step 1025.

In view of all the above, new spin-transfer oscillators have increased output power without requiring an increase to the magnitude of the bias current and also without requiring an increase to the magnetoresistance of the MR film.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, it will be readily apparent to one of ordinary skill in the art that the configuration, geometry, shape, and size of the openings in electrically insulative layers 130, 330, and 530 may vary, and that the foregoing discussion of certain of these embodiments does not necessarily represent a complete description of all possible embodiments. Similarly, the material compositions of the various elements of the oscillators may vary from the details described above. Furthermore, the specific number of resistors or MR contacts contained within the various portions of the oscillators can vary from the descriptions provided herein. Additionally, in FIGS. 5, 6, 8, and 9, the illustrated current sources can be replaced with a voltage source, particularly when any of the arrays in those figures use an injection locking mechanism for phase coupling.

All elements claimed in any particular claim are essential to the invention claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A circuit comprising:
   an oscillator comprising at least one of:
      a parallel array of magnetoresistive contacts to at least one individualized area of at least one magnetoresistive film, each of the magnetoresistive contacts of the parallel array comprising a spin transfer oscillator; and
   a series array of magnetoresistive contacts to individualized areas of at least one magnetoresistive film, each of the magnetoresistive contacts of the parallel array comprising a spin transfer oscillator;
   one of a current or voltage source coupled to the oscillator.

2. The circuit of claim 1 wherein:
   the oscillator comprises the parallel array of magnetoresistive contacts to the at least one individualized area of the at least one magnetoresistive film.

3. The circuit of claim 2 wherein:
   the parallel array of magnetoresistive contacts further comprises:
      a parallel array of ferromagnetic point contacts; and
   the at least one individualized area of the at least one magnetoresistive film of the parallel array of magnetoresistive contacts further comprises:
      a single magnetoresistive film.

4. The circuit of claim 1 wherein:
   the oscillator comprises the series array of magnetoresistive contacts to the individualized areas of the at least one magnetoresistive film.

5. The circuit of claim 4 wherein:
   the series array of magnetoresistive contacts further comprises: a series array of ferromagnetic point contacts; and
   the individualized areas of the at least one magnetoresistive film comprises: discrete portions of a single magnetoresistive film.

6. The circuit of claim 1 wherein:
   the at least one individualized area of the at least one magnetoresistive film and the individualized areas of the at least one magnetoresistive film are selected from the group consisting of a tunneling magnetoresistive film, a giant magnetoresistive film, and a colossal magnetoresistive film.

7. The circuit of claim 1 wherein:
   the oscillator comprises the parallel array of magnetoresistive contacts and the series array of magnetoresistive contacts;
   the parallel array of magnetoresistive contacts comprises a parallel array of $N_1$ magnetoresistive contacts;
   $N_1$ is greater than 1;
   the series array of magnetoresistive contacts comprises a series array of $N_2$ magnetoresistive contacts; and
   $N_2$ is greater than 1.

8. The circuit of claim 7 wherein: $N_2$ is greater than $N_1$.

9. The circuit of claim 7 further comprising:
   an inductor coupled in series with the parallel array of $N_1$ magnetoresistive contacts and in parallel with the series array of $N_2$ magnetoresistive contacts; and
   a resistor coupled in series with the parallel array of $N_1$ magnetoresistive contacts and in parallel with the series array of $N_2$ magnetoresistive contacts.

10. The circuit of claim 9 wherein:
    an output power of the oscillator is increased by a factor approximately proportional to a sum of $N_1$ and $N_2$ as compared to a single contact to a magnetoresistive film.

11. The circuit of claim 7 wherein:
    the oscillator further comprises $N_1$ minus one of the series array of $N_2$ magnetoresistive contacts in addition to the series array of $N_2$ magnetoresistive contacts; and
    the $N_1$ minus one of the series array of $N_2$ magnetoresistive contacts are in parallel with the series array of $N_2$ magnetoresistive contacts and are in series with the parallel array of $N_1$ magnetoresistive contacts.

12. The circuit of claim 11 wherein:
    an output power of the oscillator is increased by a factor approximately proportional to $N_1$ times a sum of $N_2$ plus one as compared to a single contact to a magnetoresistive film.

13. The circuit of claim 1 wherein:
    the oscillator comprises the parallel array of magnetoresistive contacts;
    the parallel array of magnetoresistive contacts comprises a parallel array of $N_1$ magnetoresistive contacts;
    the oscillator further comprises an additional $N_2$ minus one parallel arrays of $N_1$ magnetoresistive contacts;
    $N_1$ is greater than 1;
    $N_2$ is greater than 1; and
    the $N_2$ parallel arrays of $N_1$ magnetoresistive contacts are in series with each other.

14. The circuit of claim 13 wherein:
    an output power of the oscillator is increased by a factor approximately proportional to $N_1$ multiplied by $N_2$ as compared to a single contact to a magnetoresistive film.

15. A spin-transfer oscillator comprising:

a parallel array of $N_1$ ferromagnetic point contacts to at least one portion of at least one magnetoresistive film; and a series array of $N_2$ ferromagnetic point contacts to separated portions of at least one magnetoresistive film, wherein:

an output frequency of the spin-transfer oscillator is frequency tunable as a function of one of an applied voltage, current, or magnetic field;

$N_1$ is greater than 1;

$N_2$ is greater than 1;

portions of the at least one magnetoresistive film are located under the $N_1$ ferromagnetic point contacts and are coupled together by direct magnetic coupling; and portions of the at least one magnetoresistive film are located under the $N_2$ ferromagnetic point contacts and are coupled together by injection current locking.

16. The spin-transfer oscillator of claim 15 wherein:

the at least one magnetoresistive film of the parallel array of $N_1$ ferromagnetic point contacts is a first portion of a single magnetoresistive film; and the at least one magnetoresistive film of the series array of $N_2$ ferromagnetic point contacts is a second portion of the single magnetoresistive film.

17. The spin-transfer oscillator of claim 16 further comprising:

an inductor coupled in series with the parallel array of $N_1$ ferromagnetic point contacts; and a resistor coupled in series with the inductor and the parallel array of $N_1$ ferromagnetic point contacts, wherein:

the series array of $N_2$ ferromagnetic point contacts is in series with the parallel array of $N_1$ ferromagnetic point contacts and is in parallel with the inductor and the resistor; and an output power of the spin-transfer oscillator is increased by a factor approximately proportional to $(N_1+N_2)$ as compared to a single contact to the single magnetoresistive film.

18. The spin-transfer oscillator of claim 16 further comprising:

$(N_1-1)$ of the series array of $N_2$ ferromagnetic point contacts to the separated portions of the at least one magnetoresistive film, in addition to the series array of $N_2$ ferromagnetic point contacts to the separated portions of the at least one magnetoresistive film, wherein:

the $(N_1-1)$ of the series array of $N_2$ ferromagnetic point contacts are in parallel with each other;

the $(N_1-1)$ of the series array of $N_2$ ferromagnetic point contacts are in parallel with the series array of $N_2$ ferromagnetic point contacts;

the $(N_1-1)$ of the series array of $N_2$ ferromagnetic point contacts and the series array of $N_2$ ferromagnetic point contacts are in series with the parallel array of $N_1$ ferromagnetic point contacts; and an output power of the spin-transfer oscillator is increased by a factor approximately proportional to $(N_1 \times (N_2+1))$ as compared to a single contact to the single magnetoresistive film.

19. The spin-transfer oscillator of claim 18 wherein: $N_2$ is greater than $N_1$.

20. A spin-transfer oscillator comprising:

$N_2$ parallel arrays of $N_1$ ferromagnetic point contacts to at least one portion of at least one magnetoresistive film, wherein:

$N_1$ is greater than 1;

$N_2$ is greater than 1;

the $N_2$ parallel arrays of $N_1$ ferromagnetic point contacts are in series with each other;

an output frequency of the spin-transfer oscillator is frequency tunable as a function of one of an applied voltage, current, or magnetic field; and an output power of the spin-transfer oscillator is increased by a factor approximately proportional to $(N_1 \times N_2)$ as compared to a single contact to the at least one magnetoresistive film.

21. The spin-transfer oscillator of claim 20 wherein:

the at least one magnetoresistive film of the $N_2$ parallel array of $N_1$ ferromagnetic point contacts is a single magnetoresistive film.

22. The spin-transfer oscillator of claim 21 wherein:

$N_2$ is greater than $N_1$.

* * * * *

UNITED STATES PATENT AND TRADEMARK OFFICE
CERTIFICATE OF CORRECTION

| | | |
|---|---|---|
| PATENT NO. | : 7,635,903 B2 | Page 1 of 1 |
| APPLICATION NO. | : 11/225973 | |
| DATED | : December 22, 2009 | |
| INVENTOR(S) | : Frederick B Mancoff et al. | |

It is certified that error appears in the above-identified patent and that said Letters Patent is hereby corrected as shown below:

Column 15, line 45, "and" should be changed to --or--.

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

PATENT NO.        : 7,635,903 B2                                        Page 1 of 1
APPLICATION NO.   : 11/225973
DATED             : December 22, 2009
INVENTOR(S)       : Mancoff et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1135 days.

Signed and Sealed this

Ninth Day of November, 2010

David J. Kappos
*Director of the United States Patent and Trademark Office*